(12) United States Patent
Hong

(10) Patent No.: US 11,171,602 B2
(45) Date of Patent: Nov. 9, 2021

(54) RC OSCILLATING CIRCUIT

(71) Applicant: SHANGHAI HUAHONG GRACE SEMICONDUCTOR MANUFACTURING CORPORATION, Shanghai (CN)

(72) Inventor: Xiao Hong, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 16/913,165

(22) Filed: Jun. 26, 2020

(65) Prior Publication Data

US 2021/0036660 A1 Feb. 4, 2021

(30) Foreign Application Priority Data

Jul. 29, 2019 (CN) .......................... 201910686701.8

(51) Int. Cl.
- *H03B 5/24* (2006.01)
- *H03K 5/24* (2006.01)
- *H03K 3/0231* (2006.01)
- *H03K 3/354* (2006.01)
- *H03K 4/501* (2006.01)

(52) U.S. Cl.
CPC .............. *H03B 5/24* (2013.01); *H03K 3/0231* (2013.01); *H03K 3/354* (2013.01); *H03K 4/501* (2013.01); *H03K 5/24* (2013.01)

(58) Field of Classification Search
CPC ...... H03K 3/0231; H03K 4/501; H03K 3/354; H03B 5/24
See application file for complete search history.

(56) References Cited

U.S. PATENT DOCUMENTS

| | | | |
|---|---|---|---|
| 5,870,000 A * | 2/1999 | Matsuda | H03L 7/099 331/34 |
| 8,669,820 B2 * | 3/2014 | Abe | H03K 4/501 331/74 |
| 10,305,425 B2 * | 5/2019 | Guo | H03B 5/24 |
| 2014/0035688 A1 * | 2/2014 | Ko | H03K 3/0231 331/111 |
| 2020/0186085 A1 * | 6/2020 | Niakate | H03K 3/011 |

* cited by examiner

*Primary Examiner* — Ryan Johnson
(74) *Attorney, Agent, or Firm* — MKG, LLC

(57) ABSTRACT

The disclosure discloses an RC oscillating circuit. A first end of a capacitor is grounded, a second end of the capacitor is connected to a charging path, a discharging path and a comparator, A first input end of a comparator is connected to first reference voltage. An output end of the comparator outputs a first output signal and is connected to a control end of the discharging path. The first reference voltage provides the flipped voltage of the comparator The first output signal forms an output clock signal. A first regulating circuit is configured to regulate the magnitude of the charging current and realize coarse frequency tuning. A second regulating circuit is configured to regulate the magnitude of the first reference voltage and realize fine frequency tuning. The disclosure has the advantages of low power consumption, fast start, high precision and wide tuning range.

14 Claims, 2 Drawing Sheets

RC OSCILLATING CIRCUIT

CROSS-REFERENCES TO RELATED APPLICATIONS

This application claims priority to Chinese patent application No. CN201910686701.8 filed on Jul. 29, 2019, and entitled "RC OSCILLATING CIRCUIT", the disclosure of which is incorporated herein by reference in entirety.

TECHNICAL FIELD

The disclosure relates to a semiconductor integrated circuit, in particular to an RC oscillating circuit (OSC).

BACKGROUND

Oscillators are divided into resistance-capacitance oscillators, i.e., RC oscillators, inductance-capacitance oscillators, crystal oscillators, tuning-fork oscillators, etc. RC oscillators realize the output of oscillating signals by charging and discharging a capacitor. Compared with other types of oscillators, RC oscillators have the advantages of simple structure and high precision. Therefore, RC oscillators are very common in some System On Chips (SOCs).

RC oscillators should be designed with low power consumption, small area and high precision. Therefore, how to reduce the power consumption of the RC oscillators, reduce the area and improve the precision of the output clock signal is very important.

BRIEF SUMMARY

The technical problem to be solved by the disclosure is to provide an RC oscillator, which has the characteristics of low power consumption, fast start, high precision and wide tuning range.

In order to solve the above technical problem, the RC oscillating circuit provided by the disclosure includes:

a capacitor, a first end of the capacitor being grounded;

a charging path, an output end of the charging path being connected to a second end of the capacitor, and the charging path providing charging current for the capacitor;

a discharging path, a first end of the discharging path being grounded, and a second end of the discharging path being connected to the second end of the capacitor;

a comparator, a first input end of the comparator being connected to first reference voltage, and a second input end of the comparator being connected to capacitor charging voltage output by the second end of the capacitor.

An output end of the comparator outputs a first output signal.

The first output signal is connected to a control end of the discharging path, and the discharging path is switched on and off under the control of the first output signal.

The first reference voltage provides the flipped voltage of the comparator, and when the capacitor charging voltage is less than the flipped voltage, the first output signal enables the discharging path to be switched off, and the charging path charges the capacitor and enables the capacitor charging voltage to increase.

When the capacitor charging voltage is more than or equal to the flipped voltage, the first output signal is switched, the switched first output signal enables the discharging path to be switched on, the capacitor is discharged through the discharging path and the capacitor charging voltage decreases until a charge and discharge cycle is completed.

The first output signal forms an output clock signal.

The frequency of the output clock signal is controlled by the first reference voltage and the charging current, a first regulating circuit is configured to regulate the magnitude of the charging current and coarsely tune the frequency of the output clock signal, and a second regulating circuit is configured to regulate the magnitude of the first reference voltage and finely tune the frequency of the output clock signal.

As a further improvement, the charging path includes a first bias current source and the first bias current source provides the charging current.

As a further improvement, the discharging path consists of a first NMOS transistor, a drain of the first NMOS transistor is the second end of the discharging path, a source of the first NMOS transistor is the first end of the discharging path, and a gate of the first NMOS transistor is the control end of the discharging path.

As a further improvement, the first input end of the comparator is a positive phase input end, the second input end of the comparator is a reverse phase input end, when the capacitor charging voltage is less than the first reference voltage, the first output signal is at a high level, and when the capacitor charging voltage is more than the first reference voltage, the first output signal is at a low level.

The first output signal after reversed by a phase inverter is connected to the control end of the discharging path; a signal obtained after the first output signal is reversed by the phase inverter is a second output signal.

As a further improvement, the second output signal forms the output clock signal.

As a further improvement, the second output signal is connected to a first-stage frequency dividing circuit, the first-stage frequency dividing circuit regulates the duty cycle of the second output signal, an output end of the first-stage frequency dividing circuit outputs the output clock signal, and the output clock signal is the second output signal obtained after duty ratio regulation and frequency division.

As a further improvement, the first-stage frequency dividing circuit consists of a D-flipflop, the second output signal is connected to a clock input end of the D-flipflop, a data input end of the D-flipflop is short-circuited with a Q non-end, and a Q end of the D-flipflop outputs the output clock signal.

As a further improvement, the comparator includes a second NMOS transistor, a third NMOS transistor, a first mirror path and a second mirror path.

A source of the second NMOS transistor is grounded, a gate of the second NMOS transistor is connected to the first reference voltage, a drain of the second NMOS transistor is connected to the first mirror path, and the source-drain current of the second NMOS transistor is used as the first mirror current of the first mirror path; the second mirror path is a mirror path of the first mirror path, and the magnitude of the second mirror current of the second mirror path is proportional to the magnitude of the first mirror current.

A source of the third NMOS transistor is grounded, a gate of the third NMOS transistor is connected to the capacitor charging voltage, a drain of the third NMOS transistor is connected to the second mirror path, the drain of the third NMOS transistor outputs the first output signal, and the first output signal is a comparison signal of the source-drain current of the third NMOS transistor and the second mirror current.

As a further improvement, the magnitude of the second mirror current of the second mirror path is equal to the magnitude of the first mirror current.

As a further improvement, the magnitude of the flipped voltage is related to the first reference voltage, the threshold voltage of the second NMOS transistor, the threshold voltage of the third NMOS transistor and a gain factor ratio, and the gain factor ratio is the ratio of the gain factor of the third NMOS transistor to the gain factor of the second NMOS transistor.

As a further improvement, by using the characteristics that the threshold voltage of the second NMOS transistor, the threshold voltage of the third NMOS transistor and the gain factor ratio are all related to temperature, and the gain factors of the NMOS transistors are related to the channel width-length ratio, electron mobility and gate capacitance of a device, the second NMOS transistor and the third NMOS transistor are sized to a structure adjustable to compensate for the deviation of the frequency of the output clock signal at different temperature.

As a further improvement, the first bias current source consists of a reference current branch and a plurality of parallel current branches connected in parallel.

The reference current branch outputs reference current, and the magnitude of the current of each parallel current branch is proportional to the reference current.

The first regulating circuit includes a first control switch connected in series in each parallel current branch, and the first regulating circuit controls the switching of the first control switch.

The charging current output by the first bias current source is the sum of the reference current output by the reference current branch and the current output by each parallel current branch with the first control switch turned on, and the magnitude of the charging current is set by the first regulating circuit.

As a further improvement, the second regulating circuit includes a resistor module consisting of a first resistor and a resistor string connected in parallel, a first end of the resistor module is connected to second reference voltage, and a second end of the resistor module is grounded.

A first end of each series resistor in the resistor string is connected to an output end of the second regulating circuit through a second control switch, the output end of the second regulating circuit outputs the first reference voltage, the first reference voltage is the divided voltage value of the second reference voltage, and the second regulating circuit controls the switching of the second control switch and regulates the magnitude of first reference voltage.

As a further improvement, the first bias current source includes N parallel current branches, N is an integer, the magnitude of the current of the first parallel current branch is equal to the magnitude of the reference current, and the magnitude of the current of each subsequent parallel current branch is half of the magnitude of the current of the previous parallel current branch; the first regulating circuit provides an N-bit binary code to control each first control switch.

The resistor string includes $2^M$ series resistors, M is an integer, and the magnitude of each series resistor is equal; the second regulating circuit provides an M-bit binary code to control each second control switch.

The RC oscillating circuit further includes an operational amplifier and a first PMOS transistor.

A first input end of the operational amplifier is connected to third reference voltage, an output end of the operational amplifier is connected to a gate of the first PMOS transistor, a source of the first PMOS transistor is connected to power supply voltage, a drain of the first PMOS transistor is connected to the first end of the resistor module and a second input end of the operational amplifier.

The drain of the first PMOS transistor outputs the second reference voltage equal to the third reference voltage.

The source-drain current of the first PMOS transistor is the ratio of the second reference voltage to the resistance value of the resistor module.

The reference current branch is a mirror circuit of the first PMOS transistor and the magnitude of the reference current is proportional to the magnitude of the source-drain current of the first PMOS transistor.

In the disclosure, by charging the capacitor through the charging path, comparing the capacitor charging voltage with the first reference voltage through the comparator and switching on and off the discharging path through the first output signal, the charge and discharge cycle of the capacitor is realized, and the frequency of the finally formed output clock signal is controlled by the first reference voltage and the charging current, the first regulating circuit can regulate the magnitude of the charging current and coarsely tune the frequency of the output clock signal, and the second regulating circuit can regulate the magnitude of the first reference voltage and finely tune the frequency of the output clock signal. Therefore, the disclosure has the characteristics of low power consumption, fast start, high precision and wide tuning range.

BRIEF DESCRIPTION OF THE DRAWINGS

The disclosure will be further described below in detail in combination with the embodiments with reference to the drawings.

DETAILED DESCRIPTION OF PREFERRED EMBODIMENTS OF THE INVENTION

Figure 1:
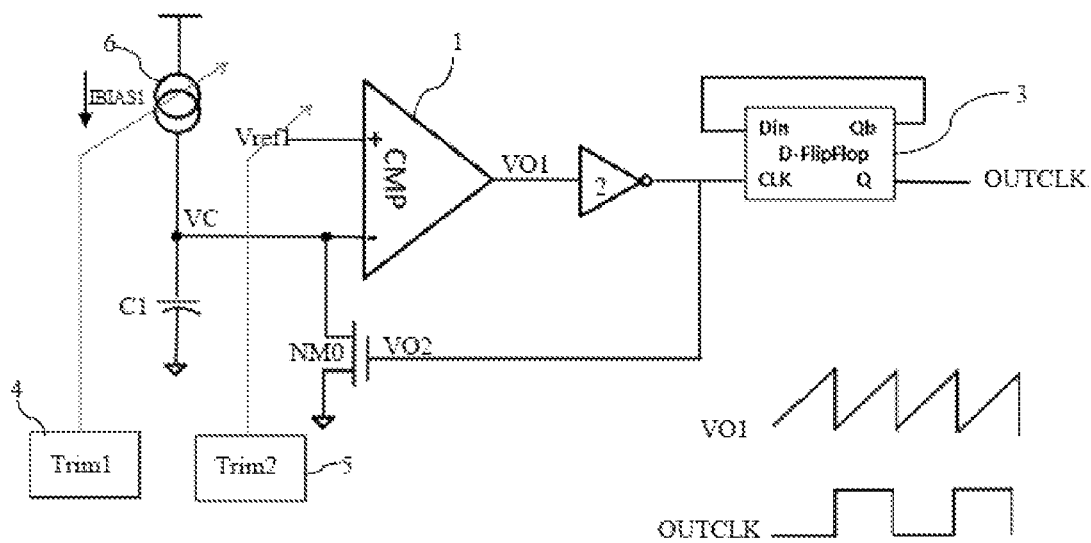
FIG. 1 is a structural diagram of an RC oscillating circuit according to one embodiment of the disclosure.

Referring to FIG. 1, it is a structural diagram of an RC oscillating circuit according to one embodiment of the disclosure. The RC oscillating circuit according to one embodiment of the disclosure includes a capacitor C1, a charging path, a discharging path and a comparator (CMP) 1.

A first end of the capacitor is grounded.

An output end of the charging path is connected to a second end of the capacitor C1 and the charging path provides charging current IBIAS1 for the capacitor. The charging path includes a first bias current source 6 and the first bias current source 6 provides the charging current IBIAS1.

A first end of the discharging path is grounded, and a second end of the discharging path is connected to the second end of the capacitor C1. The discharging path consists of a first NMOS transistor, a drain of the first NMOS transistor is the second end of the discharging path, a source of the first NMOS transistor is the first end of the discharging path, and a gate of the first NMOS transistor is the control end of the discharging path.

A first input end of the comparator 1 is connected to first reference voltage Vref1 and a second input end of the comparator 1 is connected to capacitor charging voltage VC output by the second end of the capacitor C1. In FIG. 1, the comparator is also represented by CMP.

An output end of the comparator 1 outputs a first output signal VO1.

The first output signal VO1 is connected to a control end of the discharging path, and the discharging path is switched on and off under the control of the first output signal VO1.

The first reference voltage Vref1 provides the flipped voltage of the comparator 1. When the capacitor charging voltage VC is less than the flipped voltage, the first output signal VO1 enables the discharging path to be switched off, and the charging path charges the capacitor C1 and enables the capacitor charging voltage VC to increase.

When the capacitor charging voltage VC is more than or equal to the flipped voltage, the first output signal VO1 is switched, the switched first output signal VO1 enables the discharging path to be switched on, the capacitor C1 is discharged through the discharging path and the capacitor charging voltage VC decreases until a charge and discharge cycle is completed.

In the embodiment of the disclosure, the first input end of the comparator 1 is a positive phase input end, the second input end of the comparator 1 is a reverse phase input end, when the capacitor charging voltage VC is less than the first reference voltage Vref1, the first output signal VO1 is at a high level, and when the capacitor charging voltage VC is more than the first reference voltage Vref1, the first output signal VO1 is at a low level.

The first output signal VO1 forms an output clock signal OUTCLK.

In the embodiment of the disclosure, the first output signal VO1 after reversed by a phase inverter 2 is connected to the control end of the discharging path; a signal obtained after the first output signal VO1 is reversed by the phase inverter 2 is a second output signal VO2. The second output signal VO2 forms the output clock signal OUTCLK. The second output signal VO2 is connected to a first-stage frequency dividing circuit 3, the first-stage frequency dividing circuit 3 regulates the duty cycle of the second output signal VO2, an output end of the first-stage frequency dividing circuit 3 outputs the output clock signal OUTCLK, and the output clock signal OUTCLK is the second output signal VO2 obtained after duty ratio regulation and frequency division.

The first-stage frequency dividing circuit 3 consists of a D-flipflop. The second output signal VO2 is connected to a clock input end, i.e., CLK end, of the D-flipflop. A data input end, i.e., a Din end, of the D-flipflop is short-circuited with a Q non-end, i.e., Qb end. A Q end of the D-flipflop outputs the output clock signal OUTCLK. In FIG. 1, the D-flipflop is also represented by D-FlipFlop.

The frequency of the output clock signal OUTCLK is controlled by the first reference voltage Vref1 and the charging current IBIAS1, a first regulating circuit 4 is configured to regulate the magnitude of the charging current IBIAS1 and coarsely tune the frequency of the output clock signal OUTCLK, and a second regulating circuit 5 is configured to regulate the magnitude of the first reference voltage Vref1 and finely tune the frequency of the output clock signal OUTCLK. In FIG. 1, the first regulating circuit is also represented by Trim1, and the second regulating circuit is also represented by Trim2.

In the embodiment of the disclosure illustrated in FIG. 1, the capacitor C1 is charged through the charging current IBIAS1. When the capacitor charging voltage VC is charged to a certain extent, it will be compared with the first reference voltage Vref1. When VC>Vref1, the first output signal VO1 at the output end of the comparator 1 is pulled down. After passing through the first-stage phase inverter 2, the voltage VO2 is raised. At this moment, the first NMOS transistor NM0 is switched on, and then the capacitor charging voltage VC is pulled down. Once the capacitor charging voltage VC is pulled down, when VC<Vref1, the first output signal VO1 output by the comparator 1 is high, the first NMOS transistor NM0 is switched off, and the charging current IBIAS1 continuously charges the capacitor. In this way, a clock cycle is formed.

Since the duration that the capacitor charging voltage VC is pulled down is very short, the duty cycle of the periodic signal of the first output signal VO1 is far more than 50%, so the output clock signal OUTCLK with the duty cycle of 50% needs to be output after first-stage frequency division. The clock cycle of the output clock signal OUTCLK may be expressed as:

$$T=2*C*(Vref1-0)/IBIAS1 \quad (1)$$

where T represents the clock cycle of the output clock signal OUTCLK, C represents the capacitance value of the capacitance C1, and Vref1 corresponds to the magnitude of the flipped voltage. FIG. 1 further illustrates curves of the first output signal VO1 and the output clock signal OUTCLK.

The embodiment of the disclosure provides rich frequency tuning ports to realize coarse tuning of the frequency by controlling the charging current IBIAS1 and to realize fine tuning of the frequency by controlling the first reference voltage Vref1.

In the embodiment of the disclosure, by charging the capacitor C1 through the charging path, comparing the capacitor charging voltage VC with the first reference voltage Vref1 through the comparator 1 and switching on and off the discharging path through the first output signal VO1, the charge and discharge cycle of the capacitor C1 is realized, and the frequency of the finally formed output clock signal OUTCLK is controlled by the first reference voltage Vref1 and the charging current IBIAS1, the first regulating circuit 4 can regulate the magnitude of the charging current IBIAS1 and coarsely tune the frequency of the output clock signal OUTCLK, and the second regulating circuit 5 can regulate the magnitude of the first reference voltage Vref1 and finely tune the frequency of the output clock signal OUTCLK. Therefore, the embodiment of the disclosure has the characteristics of low power consumption, fast start, high precision and wide tuning range.

Figure 2:
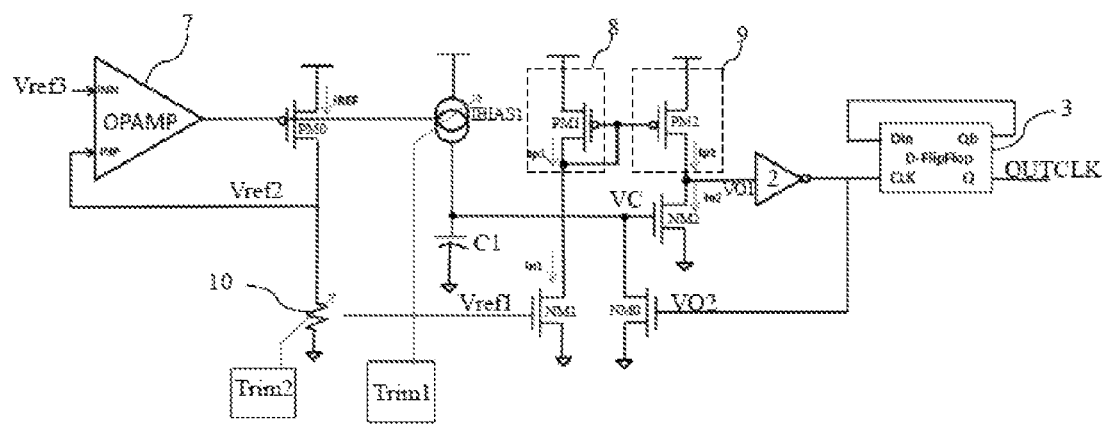
FIG. 2 is a structural diagram of an RC oscillating circuit according to one exemplary embodiment of the disclosure.

Referring to FIG. 2, it is a structural diagram of an RC oscillating circuit according to one exemplary embodiment of the disclosure. The exemplary embodiment of the disclosure is obtained by making a further improvement based on the embodiment of the disclosure illustrated in FIG. 1. The exemplary embodiment of the disclosure further has the following features.

The comparator 1 includes a second NMOS transistor NM1, a third NMOS transistor NM2, a first mirror path 8 and a second mirror path 9.

A source of the second NMOS transistor NM1 is grounded, a gate of the second NMOS transistor NM1 is connected to the first reference voltage Vref1, a drain of the second NMOS transistor NM1 is connected to the first mirror path 8, and the source-drain current In1 of the second NMOS transistor NM1 is used as the first mirror current Ip1 of the first mirror path 8; the second mirror path 9 is a mirror path of the first mirror path 8, and the magnitude of the second mirror current Ip2 of the second mirror path 9 is proportional to the magnitude of the first mirror current Ip1.

A source of the third NMOS transistor NM2 is grounded, a gate of the third NMOS transistor NM2 is connected to the capacitor charging voltage VC, a drain of the third NMOS transistor NM2 is connected to the second mirror path 9, the drain of the third NMOS transistor NM2 outputs the first output signal VO1, and the first output signal VO1 is a comparison signal of the source-drain current In2 of the third NMOS transistor NM2 and the second mirror current Ip2.

The magnitude of the flipped voltage is related to the first reference voltage Vref1, the threshold voltage Vthn1 of the second NMOS transistor NM1, the threshold voltage Vthn2 of the third NMOS transistor NM2 and a gain factor ratio, and the gain factor ratio is the ratio of the gain factor βn2 of the third NMOS transistor NM2 to the gain factor βn1 of the second NMOS transistor NM1. That is, the gain factor ratio is βn2/βn1.

By using the characteristics that the threshold voltage Vthn1 of the second NMOS transistor NM1, the threshold voltage Vthn2 of the third NMOS transistor NM2 and the gain factor ratio βn2/βn1 are all related to temperature, and the gain factors of the NMOS transistors are related to the channel width-length ratio, electron mobility and gate capacitance of a device, the second NMOS transistor NM1 and the third NMOS transistor NM2 are sized to a structure adjustable to compensate for the deviation of the frequency of the output clock signal OUTCLK at different temperature. Now analysis is made below in combination with the formula.

The magnitude of the flipped voltage can be obtained by adopting the following methods: when charging makes the capacitor charging voltage VC increase, the source-drain current In2 of the third NMOS transistor NM2 also increases; when the source-drain current In2 of the third NMOS transistor Nm2 increases to more than or equal to the second mirror current Ip2, the phase inverter 2 will flip, and the magnitude of the capacitor charging voltage VC corresponds to the magnitude of the flipped voltage. It is assumed that the magnitude of the second mirror current Ip2 of the second mirror path 9 is equal to the magnitude of the first mirror current Ip1. Since the first mirror current Ip1 is equal to the source drain current In1 of the second NMOS transistor NM1, the source-drain current In1 of the second NMOS transistor NM1 is equal to the source-drain current In2 of the third NMOS transistor NM2 when flipping.

The saturated current formula of MOSFET is $I_{dssat}=½β*(Vgs–Vth)^2$, where $I_{dssat}$ is the saturated source-drain current of MOSFET, Vgs is the gate-source voltage of MOSFET, Vth is the threshold voltage of MOSFET, and β is the gain factor.

The gate-source voltage of the second NMOS transistor NM1 which is Vref1 and the gate source voltage of the third NMOS transistor NM2 which is VC are brought into the saturated current formula of the corresponding MOSFET. VC, i.e., the flipped voltage when flipping, can be obtained by using In1=Ip1.

$$VC = \frac{Vref1}{\sqrt{\beta n2/\beta n1}} + Vthn2 - \frac{Vthn1}{\sqrt{\beta n2/\beta n1}} \quad (2)$$

By replacing the flipped voltage Vref1 in formula (1) with VC, the following can be obtained:

$$T = 2*\left[C*\frac{\left(\frac{Vref1}{\sqrt{\beta n2/\beta n1}} + Vthn2 - \frac{Vthn1}{\sqrt{\beta n2/\beta n1}} - 0\right)}{IBIAS1} + Td\right] \quad (3)$$

In formula (3), Td is delay time, including the logic delay from the output of the third NMOS transistor NM2 to the first NMOS transistor NM0 and the on and off time of the first NMOS transistor NM0, and Td is at a magnitude of ps and accounts for a small proportion in the clock cycle T, which is thus not separately analyzed here.

From formula (3), it can be seen that βn2/βn1 is a parameter related to temperature, Vth including Vthn1 and Vthn2 is also a parameter related to temperature, and the values of βn2 and βn1 are related to the size of the corresponding MOSFET, so the deviation of the frequency at different temperature can be compensated by optimizing the size of the second NMOS transistor NM1 and the third NMOS transistor NM2.

Figure 3:
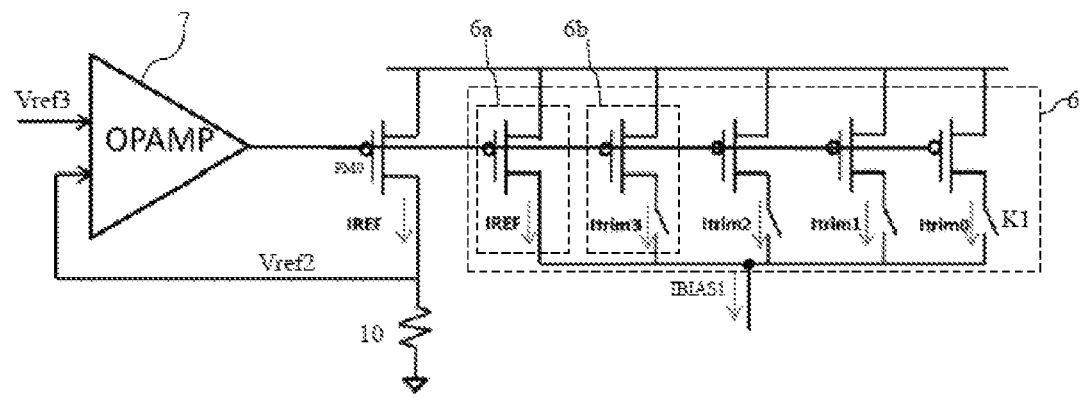
FIG. 3 is a structural diagram of a first regulating circuit according to one exemplary embodiment of the disclosure.

Referring to FIG. 3, it is a structural diagram of a first regulating circuit according to one exemplary embodiment of the disclosure. The first bias current source 6 consists of a reference current branch 6a and a plurality of parallel current branches 6b connected in parallel.

The reference current branch 6a outputs reference current IREF. The magnitude of the current of each parallel current branch 6b is proportional to the reference current IREF. In one exemplary embodiment of the disclosure, the first bias current source includes N parallel current branches 6b, N is an integer, the magnitude of the current of the first parallel current branch is equal to the magnitude of the reference current, and the magnitude of the current of each subsequent parallel current branch is half of the magnitude of the current of the previous parallel current branch. That is, the ratios of the magnitude of the current of the N parallel current branches 6b to the reference current IREF are respectively 1, $2^{-1}$, $2^{-2}$ ... $2^{-(n-1)}$. The first regulating circuit provides an N-bit binary code to control each first control switch.

In FIG. 3, N is 4. That is, the first bias current source 6 includes four parallel current branches 6b, and the ratios of the magnitude of the current of the N parallel current branches 6b to the reference current IREF are respectively 1, ½, ¼ and ⅛. In FIG. 3, the current of the four parallel current branches 6b is respectively represented by Itrim0, Itrim1, Itrim2 and Itrim3, The reference current branch 6a and each parallel current branch 6b each consist of a PMOS transistor. The first regulating circuit 4 includes a first control switch K1 connected in series in each parallel current branch 6b. The first regulating circuit 4 controls the switching of the first control switch K1. The first regulating circuit 4 provides a 4-bit binary code to control each first control switch K1.

The charging current IBIAS1 output by the first bias current source 6 is the sum of the reference current IREF output by the reference current branch 6a and the current output by each parallel current branch 6b with the first control switch turned on. The magnitude of the charging current IBIAS1 is set by the first regulating circuit 4.

Figure 4:
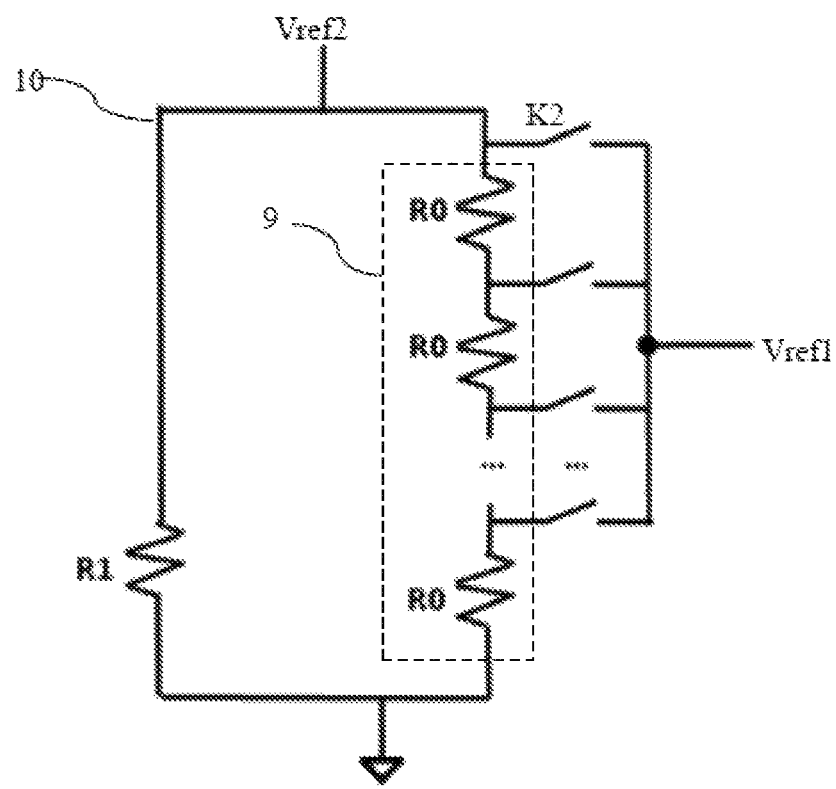
FIG. 4 is a structural diagram of a second regulating circuit according to one exemplary embodiment of the disclosure.

Referring to FIG. 4, it is a structural diagram of a second regulating circuit according to one exemplary embodiment of the disclosure. The second regulating circuit 5 includes a resistor module 10 consisting of a first resistor R1 and a resistor string 9 connected in parallel. A first end of the resistor module 10 is connected to second reference voltage Vref2. A second end of the resistor module 10 is grounded.

A first end of each series resistor R0 in the resistor string 9 is connected to an output end of the second regulating circuit 5 through a second control switch K2. The output end of the second regulating circuit 5 outputs the first reference voltage Vref1. The first reference voltage Vref1 is the divided voltage value of the second reference voltage Vref2. The second regulating circuit 5 controls the switching of the second control switch K2 and regulates the magnitude of first reference voltage Vref1. From FIG. 4, it can be seen that the second end of the bottommost series resistor R0 in the resistor string 9 is grounded, and the first end of each series resistor R0 is connected to the second end of the previous series resistor R0.

The resistor string includes $2^M$ series resistors, M is an integer, and the magnitude of each series resistor is equal. The second regulating circuit provides an M-bit binary code to control each second control switch. In FIG. 4, M is 4. The resistor string 9 includes sixteen series resistors R0, and the second regulating circuit 5 provides a 4-bit binary code to control each second control switch K2.

Referring to FIG. 3, the RC oscillating circuit further includes an operational amplifier 7 and a first PMOS transistor PM0. In FIG. 3, the operational amplifier is also represented by OPAMP.

A first input end of the operational amplifier 7 is connected to third reference voltage Vref3. An output end of the operational amplifier 7 is connected to a gate of the first PMOS transistor PM0. A source of the first PMOS transistor PM0 is connected to power supply voltage. A drain of the first PMOS transistor PM0 is connected to the first end of the resistor module 10 and a second input end of the operational amplifier 7.

The drain of the first PMOS transistor PM0 outputs the second reference voltage Vref2 equal to the third reference voltage Vref3.

The source-drain current of the first PMOS transistor PM0 is the ratio of the second reference voltage Vref2 to the resistance value of the resistor module 10. The reference current branch 6a is a mirror circuit of the first PMOS transistor PM0 and the magnitude of the reference current IREF is proportional to the magnitude of the source-drain current of the first PMOS transistor PM0. In FIG. 3, the magnitude of the source-drain current of the first PMOS transistor PM0 is the magnitude of the reference current IREF.

By simulating the circuit according to the exemplary embodiment of the disclosure, it can be obtained that the frequency stabilization time is less than 0.5 us, and the circuit according to the exemplary embodiment of the disclosure can realize the fast start and stabilization of the frequency.

By simulating at different corners, it can be obtained that the temperature coefficient (−40° C.-85° C.) of the output clock OUTCLK is within +/−1%, and the voltage coefficient (vdd+/−10%) of OUTCLK is within +/−1%.

The simulation results of the trimming circuits, i.e., the first regulating circuit and the second regulating circuit, show that the frequency of the output clock can be tuned within +/−40% of the target frequency range, and the fine tuning range can be up to +/−0.5%. Therefore, after trimming, the circuit according to the exemplary embodiment of the disclosure can output high-precision frequency.

In the circuit according to the exemplary embodiment of the disclosure, the dynamic power consumption corresponding to the output frequency of 40 MHz is less than 50 uA, so it is a low-power oscillator.

The disclosure has been described above in detail in combination with the above embodiments, which, however, shall not constitute any limitation to the disclosure. Without departing from the principle of the disclosure, one skilled in the art may make various variations and improvements, which shall also be regarded as falling into the protection scope of the disclosure.

What is claimed is:

1. An RC oscillating circuit, wherein the RC oscillating circuit comprises:
a capacitor, a first end of the capacitor being grounded;
a charging path, an output end of the charging path being connected to a second end of the capacitor, and the charging path providing charging current for the capacitor;
a discharging path, a first end of the discharging path being grounded, and a second end of the discharging path being connected to the second end of the capacitor;
a comparator, a first input end of the comparator being connected to first reference voltage, and a second input end of the comparator being connected to a capacitor charging voltage output by the second end of the capacitor, wherein
an output end of the comparator outputs a first output signal;
the first output signal is connected to a control end of the discharging path, and the discharging path is switched on and off under the control of the first output signal;
the first reference voltage provides the flipped voltage of the comparator, and when the capacitor charging voltage is less than the flipped voltage, the first output signal enables the discharging path to be switched off, and the charging path charges the capacitor and enables the capacitor charging voltage to increase;
when the capacitor charging voltage is more than or equal to the flipped voltage, the first output signal is switched, the switched first output signal enables the discharging path to be switched on, the capacitor is discharged through the discharging path and the capacitor charging voltage decreases until a charge and discharge cycle is completed;
the first output signal forms a first output clock signal;
the frequency of the first output clock signal is controlled by the first reference voltage and the charging current, a first regulating circuit is configured to regulate the magnitude of the charging current and coarsely tune the frequency of the first output clock signal, and a second regulating circuit is configured to regulate the magnitude of the first reference voltage and finely tune the frequency of the first output clock signal,
the second regulating circuit comprises a resistor module consisting of a first resistor and a resistor string connected in parallel, a first end of the resistor module is connected to a second reference voltage, and a second end of the resistor module is grounded; and
a first end of each series resistor in the resistor string is connected to an output end of the second regulating circuit through a second control switch, the output end of the second regulating circuit outputs the first reference voltage, the first reference voltage is a divided voltage value of the second reference voltage, and the second regulating circuit controls the switching of the second control switch and regulates the magnitude of the first reference voltage.

2. The RC oscillating circuit according to claim 1, wherein the charging path comprises a first bias current source and the first bias current source provides the charging current.

3. The RC oscillating circuit according to claim 1, wherein the discharging path consists of a first NMOS transistor, a drain of the first NMOS transistor is the second end of the discharging path, a source of the first NMOS transistor is the first end of the discharging path, and a gate of the first NMOS transistor is the control end of the discharging path.

4. The RC oscillating circuit according to claim 3, wherein the first input end of the comparator is a positive input end, the second input end of the comparator is a negative input end, when the capacitor charging voltage is less than the first reference voltage, the first output signal is at a high level, and when the capacitor charging voltage is more than the first reference voltage, the first output signal is at a low level;
the first output signal after reversed by a phase inverter is connected to the control end of the discharging path; and
a signal obtained after the first output signal is reversed by the phase inverter is a second output signal.

5. The RC oscillating circuit according to claim 4, wherein the second output signal forms a second output clock signal.

6. The RC oscillating circuit according to claim 5, wherein the second output signal is connected to a first-stage frequency dividing circuit, the first-stage frequency dividing circuit regulates the duty cycle of the second output signal, an output end of the first-stage frequency dividing circuit outputs a third output clock signal, and a third output clock signal is the second output signal obtained after duty ratio regulation and frequency division.

7. The RC oscillating circuit according to claim 6, wherein the first-stage frequency dividing circuit consists of a D flip-flop, the second output signal is connected to a clock input end of the D flip-flop, a data input end of the D flip-flop is short-circuited with a Q non-end, and a Q end of the D flip-flop outputs the third output clock signal.

8. The RC oscillating circuit according to claim 1, wherein the comparator comprises a second NMOS transistor, a third NMOS transistor, a first mirror path and a second mirror path;
a source of the second NMOS transistor is grounded, a gate of the second NMOS transistor is connected to the first reference voltage, a drain of the second NMOS transistor is connected to the first mirror path, and the source-drain current of the second NMOS transistor is used as the first mirror current of the first mirror path; the second mirror path is a mirror path of the first mirror path, and the magnitude of the second mirror current of the second mirror path is proportional to the magnitude of the first mirror current;
a source of the third NMOS transistor is grounded, a gate of the third NMOS transistor is connected to the capacitor charging voltage, a drain of the third NMOS transistor is connected to the second mirror path, the drain of the third NMOS transistor outputs the first output signal, and the first output signal is a comparison signal of the source-drain current of the third NMOS transistor and the second mirror current.

9. The RC oscillating circuit according to claim 8, wherein the magnitude of the second mirror current of the second mirror path is equal to the magnitude of the first mirror current.

10. The RC oscillating circuit according to claim 9, wherein the magnitude of the flipped voltage is related to the first reference voltage, the threshold voltage of the second NMOS transistor, the threshold voltage of the third NMOS transistor and a gain factor ratio, and the gain factor ratio is the ratio of the gain factor of the third NMOS transistor to the gain factor of the second NMOS transistor.

11. The RC oscillating circuit according to claim 10, wherein by using the characteristics that the threshold voltage of the second NMOS transistor, the threshold voltage of the third NMOS transistor and the gain factor ratio are all related to temperature, and the gain factors of the NMOS transistors are related to the channel width-length ratio, electron mobility and gate capacitance of a device, the sizes of the second NMOS transistor and the third NMOS transistor are set to compensate the deviation of the frequency of the first output clock signal at different temperature.

12. The RC oscillating circuit according to claim 2, wherein the first bias current source consists of a reference current branch and a plurality of parallel current branches connected in parallel;
the reference current branch outputs a reference current, and the magnitude of the current of each parallel current branch is proportional to the reference current;
the first regulating circuit comprises a first control switch connected in series in each parallel current branch, and the first regulating circuit controls the switching of the first control switch;
the charging current output by the first bias current source is the sum of the reference current output by the reference current branch and the current output by each parallel current branch with the first control switch turned on, and the magnitude of the charging current is set by the first regulating circuit.

13. The RC oscillating circuit according to claim 2, wherein the first bias current source comprises N parallel current branches, N is an integer, the magnitude of the current of the first parallel current branch is equal to the magnitude of the reference current, and the magnitude of the current of each subsequent parallel current branch is half of the magnitude of the current of the previous parallel current branch; the first regulating circuit provides an N-bit binary code to control each first control switch;
the resistor string comprises $2^M$ series resistors, M is an integer, and the magnitude of each series resistor is equal; the second regulating circuit provides an M-bit binary code to control each second control switch.

14. The RC oscillating circuit according to claim 1, wherein the RC oscillating circuit further comprises an operational amplifier and a first PMOS transistor;
a first input end of the operational amplifier is connected to third reference voltage, an output end of the operational amplifier is connected to a gate of the first PMOS transistor, a source of the first PMOS transistor is connected to power supply voltage, a drain of the first PMOS transistor is connected to the first end of the resistor module and a second input end of the operational amplifier;
the drain of the first PMOS transistor outputs the second reference voltage equal to the third reference voltage;
the source-drain current of the first PMOS transistor is the ratio of the second reference voltage to the resistance value of the resistor module;
the reference current branch is a mirror circuit of the first PMOS transistor and the magnitude of the reference current is proportional to the magnitude of the source-drain current of the first PMOS transistor.

* * * * *